(12) United States Patent
Li et al.

(10) Patent No.: US 9,929,290 B2
(45) Date of Patent: Mar. 27, 2018

(54) ELECTRICAL AND OPTICAL VIA CONNECTIONS ON A SAME CHIP

(71) Applicant: GLOBALFOUNDRIES INC., Grand Cayman (KY)

(72) Inventors: Juntao Li, Cohoes, NY (US); Kangguo Cheng, Schenectady, NY (US); Chengwen Pei, Danbury, CT (US); Geng Wang, Stormville, NY (US); Joseph Ervin, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/187,048

(22) Filed: Jun. 20, 2016

(65) Prior Publication Data
US 2017/0365725 A1 Dec. 21, 2017

(51) Int. Cl.
*G02B 6/12* (2006.01)
*H01L 31/0232* (2014.01)
*H01L 23/48* (2006.01)
*H01L 31/02* (2006.01)
*G02B 6/122* (2006.01)
*G02B 6/42* (2006.01)

(52) U.S. Cl.
CPC ........ *H01L 31/02327* (2013.01); *G02B 6/122* (2013.01); *G02B 6/428* (2013.01); *H01L 23/481* (2013.01); *H01L 31/02005* (2013.01); *G02B 2006/12061* (2013.01); *G02B 2006/12123* (2013.01)

(58) Field of Classification Search
CPC ............. H01L 31/02327; H01L 23/481; H01L 31/02005; G02B 6/122; G02B 2006/12061; G02B 2006/12123
See application file for complete search history.

(56) References Cited

U.S. PATENT DOCUMENTS

| 6,152,609 | A | 11/2000 | Dzyck et al. |
| 7,801,398 | B2 * | 9/2010 | Kodama ............... G02B 6/42 |
| | | | 385/14 |
| 8,283,766 | B2 | 10/2012 | Harada et al. |

(Continued)

FOREIGN PATENT DOCUMENTS

| CN | 103403865 | 11/2013 |
| EP | 2612356 | 7/2013 |

OTHER PUBLICATIONS

Mahavir S. Parekh, et al., "Electrical, Optical and Fluidic Through-Silicon Vias for Silicon Interposer Applications", Electronic Components and Technology Conference (ECTC), 2011 IEEE 61st, 7 pages.

*Primary Examiner* — Ellen Kim
(74) *Attorney, Agent, or Firm* — Michael Le Strange; Andrew M. Calderon; Roberts Mlotkowski Safran, Cole & Calderon, P.C.

(57) ABSTRACT

The present disclosure relates to semiconductor structures and, more particularly, to electrical and optical via connections on a same chip and methods of manufacture. The structure includes an optical through substrate via (TSV) comprising an optical material filling the TSV. The structure further includes an electrical TSV which includes a liner of the optical material and a conductive material filling remaining portions of the electrical TSV.

19 Claims, 5 Drawing Sheets

(56) References Cited

U.S. PATENT DOCUMENTS

| | | | | |
|---|---|---|---|---|
| 8,647,920 B2* | 2/2014 | Tezcan | ............... | H01L 21/7682 |
| | | | | 257/626 |
| 8,742,590 B2* | 6/2014 | Beyne | .................. | H01L 21/764 |
| | | | | 257/773 |
| 2009/0212407 A1* | 8/2009 | Foster | .................. | B81B 7/0006 |
| | | | | 257/686 |
| 2013/0285256 A1* | 10/2013 | Fischer | ................ | H01L 21/486 |
| | | | | 257/774 |
| 2016/0266341 A1* | 9/2016 | Park | ...................... | G02B 6/428 |

* cited by examiner

ELECTRICAL AND OPTICAL VIA CONNECTIONS ON A SAME CHIP

FIELD OF THE INVENTION

The present disclosure relates to semiconductor structures and, more particularly, to electrical and optical via connections on a same chip and methods of manufacture.

BACKGROUND

Integrated optical and electrical through silicon vias (TSVs) are critical for multifunctional systems on chip (MSoC), for example, having optical circuits and electrical circuits on a single chip. The integration of the optical and electrical TSVs is a great challenge, though. Specifically, current processes require multiple mask sets and complex processes, leading to overall low yields and higher manufacturing costs.

SUMMARY

In an aspect of the disclosure, a structure comprises: an optical through substrate via (TSV) comprising an optical material filling the TSV; and an electrical TSV comprising a liner of the optical material and a conductive material filling remaining portions of the electrical TSV.

In an aspect of the disclosure, a structure comprises: an optical through silicon via (TSV) having an annular shape and comprising an optical material; an electrical TSV having a via shape and comprising a liner of the optical material and a conductive material filling remaining portions of the electrical TSV; an airgap formed in the silicon and in alignment with the optical TSV; and a photodetector in alignment with the airgap and the optical TSV.

In an aspect of the disclosure, a method comprises: forming an annular via and a via shaped via in a substrate using a same lithography process; filling the annular via with optical material while forming a liner on sidewalls of a electrical TSV via with the optical material, in a same deposition process; filling remaining portions of the electrical TSV via with conductive material; removing a back side of the substrate to form an annular optical TSV comprising the annular via with the optical material and an electrical via from the electrical TSV via with the optical material and the conductive material; and forming an airgap in the substrate in alignment with the annular optical TSV.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrical and optical via connections on a same chip and methods of manufacture. More specifically, the present disclosure provides a method to fabricate optical TSVs and electrical TSVs on a single chip, resulting in an advantageously designed structure. In embodiments, for example, an annular-shape optical TSV and via-shape electric TSV are formed simultaneously on a single chip, enabling a mask-free process. The annular-shape optical TSV and via-shape electric TSV can be formed with other devices on the same chip.

The electrical and optical via connections of the present disclosure can be manufactured in a number of ways using a number of different tools. In general, though, the methodologies and tools are used to form structures with dimensions in the micrometer and nanometer scale. The methodologies, i.e., technologies, employed to manufacture the electrical and optical via connections of the present disclosure have been adopted from integrated circuit (IC) technology. For example, the structures are built on wafers and are realized in films of material patterned by photolithographic processes on the top of a wafer. In particular, the fabrication of the electrical and optical via connections uses three basic building blocks: (i) deposition of thin films of material on a substrate, (ii) applying a patterned mask on top of the films by photolithographic imaging, and (iii) etching the films selectively to the mask.

Figure 1A:
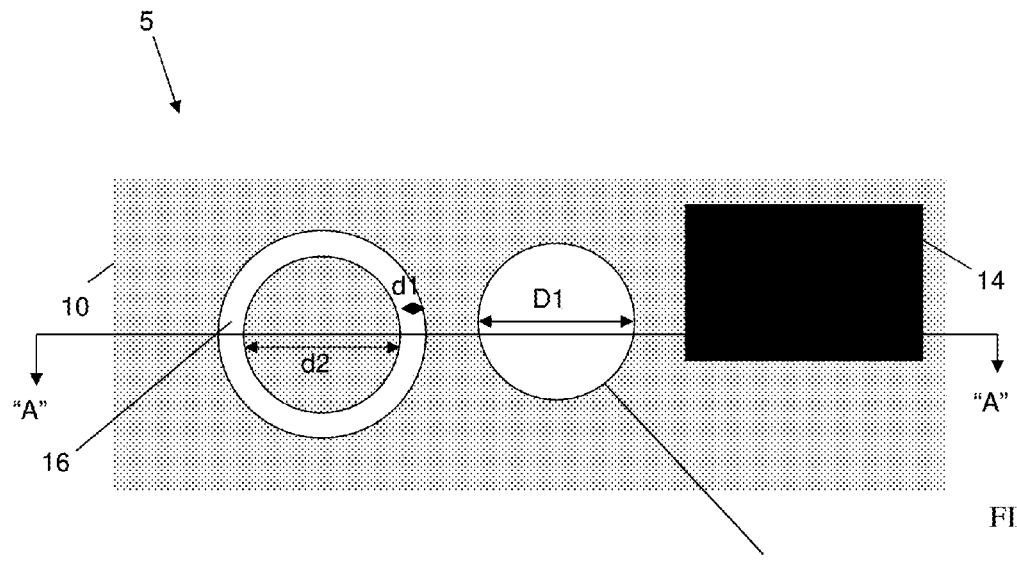
FIG. 1A shows a top down view of a structure and respective fabrication processes in accordance with aspects of the present disclosure.
Figure 1B:
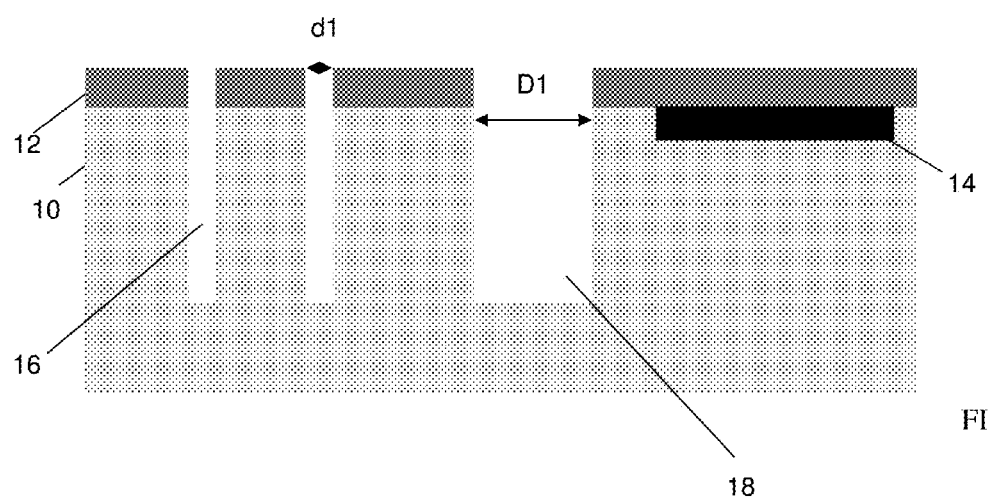
FIG. 1B shows a cross-sectional view of the structure of FIG. 1A, along line A-A.

FIG. 1A shows a top down view of a structure and respective fabrication processes in accordance with aspects of the present disclosure. FIG. 1B shows a cross-sectional view of the structure of FIG. 1A, along line A-A. It should be noted that the top down view of FIG. 1A does not include a mask, in order to show the different devices/circuits formed on or within the substrate.

More specifically and referring to both FIGS. 1A and 1B, the structure 5 includes a substrate 10 with a plurality of devices 14. In embodiments, the substrate 10 can be a semiconductor material such as, for example, Si; although other substrates are contemplated herein, e.g., SiGe, etc. The devices 14 can be any active or passive devices formed using conventional CMOS process. For example, the devices 14 can be logic devices, analog devices, processors, resistors, capacitors, etc., or other front end of the line (FEOL) or back end of the line (BEOL) devices.

Still referring to FIGS. 1A and 1B, an optical via 16 and an electrical via 18 can be formed in the substrate 10. In embodiments, the optical via 16 is preferably an annular shaped via with a via width dimension of "d1" and a width of the core portion of the annular shape, e.g., circumferential dimension, "d2". The electrical via 18 has a width (diameter) of "D1", where D1>d1. In embodiments, the dimension "d1" can be about 50 nm to 2 micron and dimension "d2" can be about 100 nm to about 5 micron or more as needed; although other dimensions for d1 and d2 are also contemplated herein. On the other hand, dimension "D1" is preferably greater than 300 nm and more preferably ranges from about 1 micron to about 10 microns, or more as needed. Although the electrical via 18 is shown with a circular cross-section, other shapes are also contemplated herein.

In embodiments, the optical via 16 and the electrical via 18 can be fabricated with a single mask 12, e.g., using mask 12 with a single lithography step. For example, in embodiments, the mask 12 can be an oxide material, nitride material, carbide, etc. In more specific embodiments, a resist formed over the mask 12 can be exposed to energy (e.g., light) to form one or more openings (e.g., patterns) which correspond to the dimensions "d1" and "D1". An etching process, e.g., reactive ion etching (RIE), can be performed through the openings, with a chemistry selective to the mask 12 and underlying semiconductor material 10. The etching process will form openings in the semiconductor material 10 partly through the depth thereof. The resist is then removed using conventional stripants, e.g., oxygen ashing.

Figure 2:
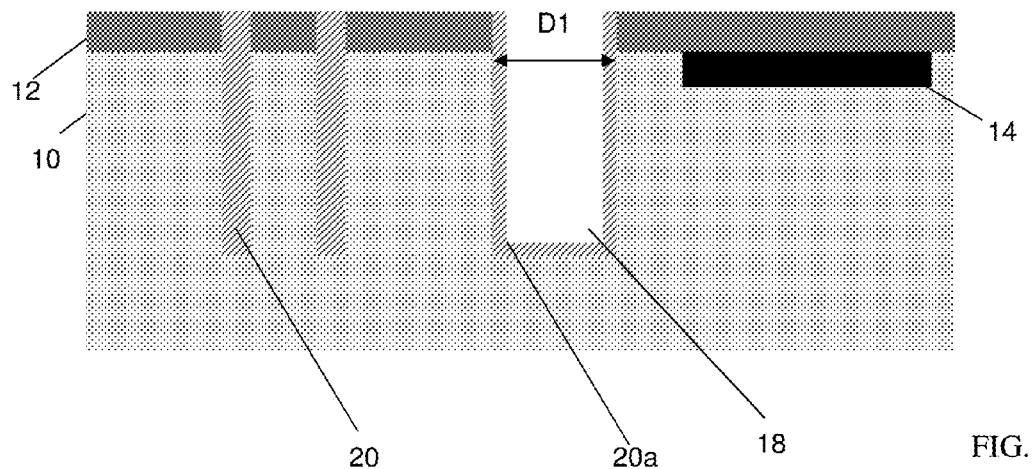
FIG. 2 shows an optical via filled with optical material and an electrical via lined with the optical material and respective fabrication processes in accordance with aspects of the present disclosure.

In FIG. 2, a deposition process is performed to fill the optical via 16 with optical material 20, which will also form a liner 20a on sidewalls of the electrical via 18. It should be understood by those of skill in the art that due to the wider dimension "D1" of the electrical via 18, the deposited optical material will not pinch off the opening of the electrical via 18; instead, in embodiments, the optical material will form a liner 20a of a thickness approximately equaling the dimension "d1" of the optical via 16, e.g., about 50 nm to about 2 micron in thickness. In embodiments, the deposition process is a chemical vapor deposition (CVD) process using, e.g., an optical material. For example, the optical material is a transparent material such as an oxide material, with the CVD process being an oxide flow. Any residual material formed on the mask 12 can be removed by a chemical mechanical process (CMP).

Figure 3:
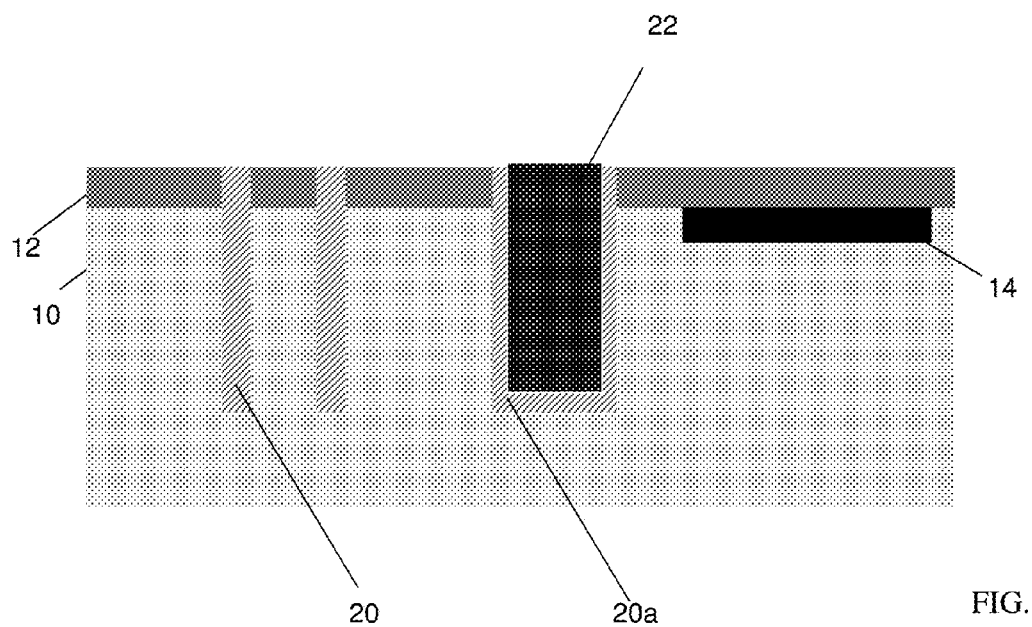
FIG. 3 shows the electrical via filled with conductive material and respective fabrication processes in accordance with aspects of the present disclosure.

As shown in FIG. 3, a conductive material 22 fills in the remaining portion of the electrical via 18. In embodiments, the conductive material 22 can be a metal material. In more specific embodiments, the conductive material 22 can be tungsten, copper, aluminum, titanium, cobalt or other metal or metal alloy materials. The conductive material 22 can be deposited by a conventional CVD process, followed by a CMP process to remove any residual material from the mask 12.

Figure 4:
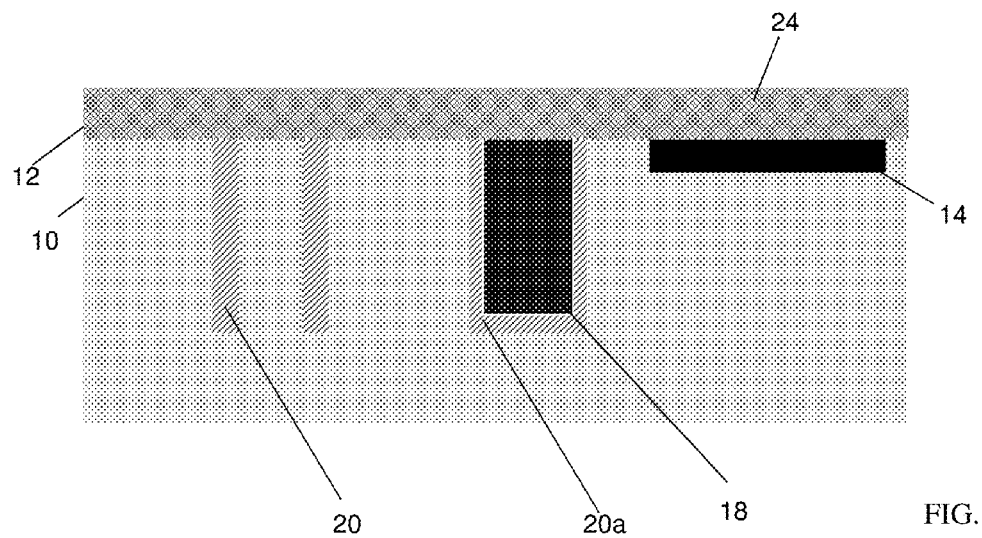
FIG. 4 shows a handle wafer attached to the structure of FIG. 3 and respective fabrication processes in accordance with aspects of the present disclosure.

Referring to FIG. 4, the mask is removed and a handle wafer or carrier 24 is attached to the substrate 10. In embodiments, the mask can be removed during the above described CMP process, e.g., the CMP process which is used to remove any residual conductive material. The handle wafer or carrier 24 can be a Si mandrel bonded to the substrate 10 via an oxide-oxide bond. In alternative embodiments, the handle wafer or carrier 24 can be attached to the substrate 10 by an adhesive or an organic glue, as examples known to those of skill in the art such that further explanation is not required for an understanding of the processes described herein.

Figure 5:
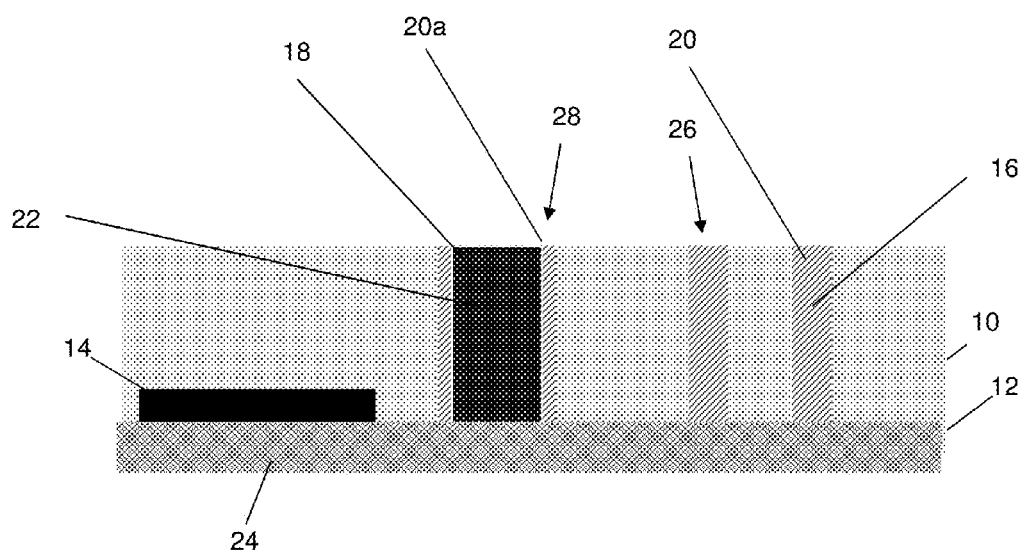
FIG. 5 shows a thinned wafer with the filled optical via and electrical via and respective fabrication processes in accordance with aspects of the present disclosure.

In FIG. 5, the back side of the substrate 10 is removed to expose the conductive material 22 as well as the transparent material 20, 20a. In this way, an optical TSV 26 and electrical TSV 28 are now fully formed within the substrate 10 on a same chip, while being able to reduce masking steps, e.g., reducing complexity of the fabrication process and resultant manufacturing costs. In embodiments, the optical TSV 26 is an annular shaped optical TSV and the electrical TSV 28 can be any via shape. The back side of the substrate 10 can be removed by known processes such as, for example, etching, grinding, polishing or any combination of such techniques.

Figure 6A:
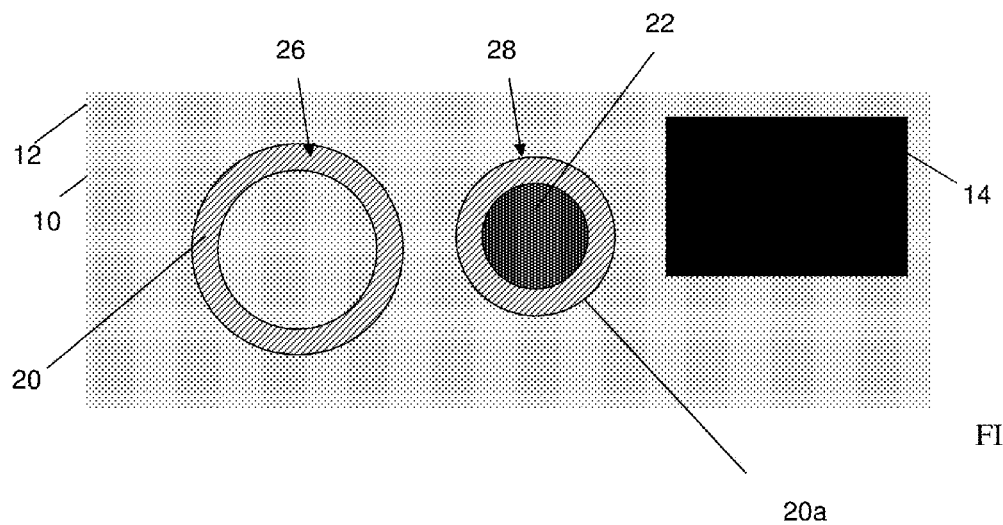
FIG. 6A shows a top down view of an optical through silicon via and an electrical through silicon via and respective fabrication processes in accordance with aspects of the present disclosure.
Figure 6B:
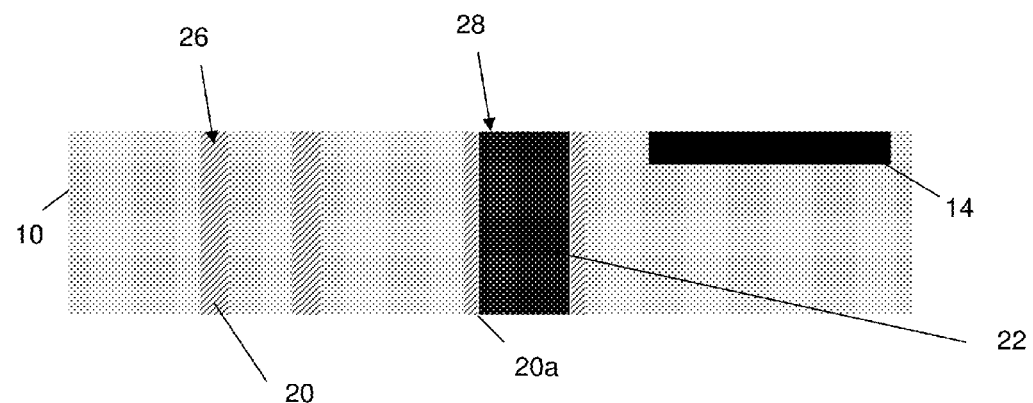
FIG. 6B shows a cross-sectional view of the structure of FIG. 6A, along line A-A.

FIG. 6A shows a top down view of the optical TSV 26 and electrical TSV 28 and respective fabrication processes in accordance with aspects of the present disclosure; whereas, FIG. 6B shows a cross-sectional view of the structure of FIG. 6A, along line A-A. In these representative figures, it is shown that the optical TSV 26 includes a core of the substrate material 10. Also, the electrical TSV 28 includes a liner of the optical material, e.g., dielectric material to insulate the conductive material 24 from the substrate 10. In embodiments, the handle wafer is also removed using known processes.

Figure 7:
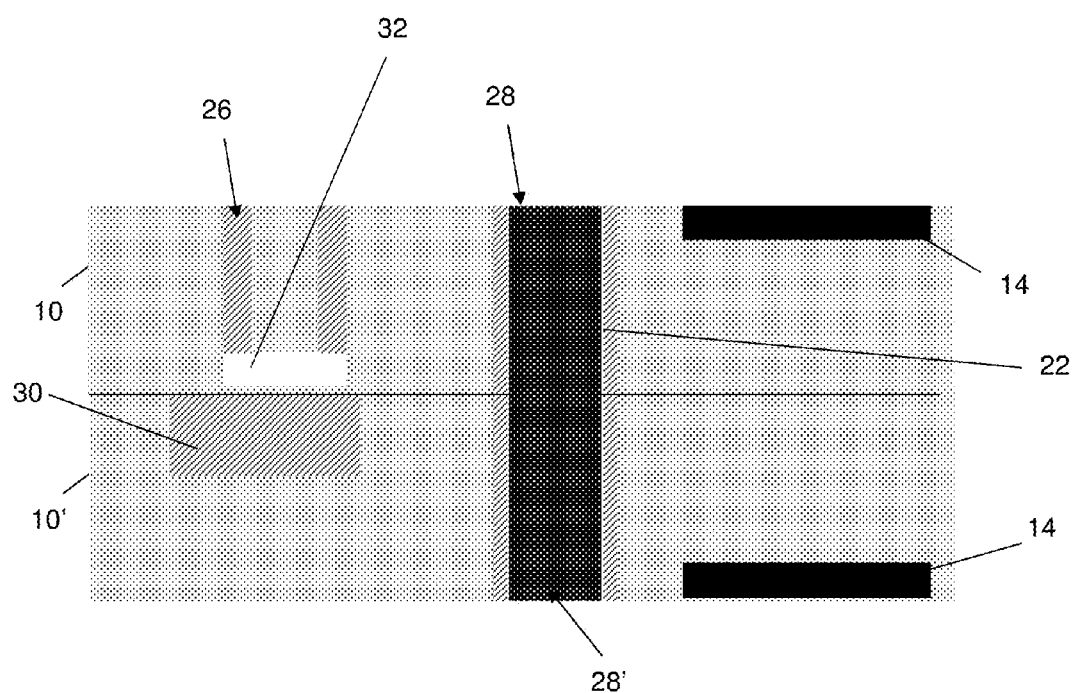
FIG. 7 shows a cross-sectional view of a final structure and respective fabrication processes in accordance with aspects of the present disclosure.

FIG. 7 shows a cross-sectional view of a final structure and respective fabrication processes in accordance with aspects of the present disclosure. More specifically, the optical TSV 26 is shown to be attached to a substrate 10' having a photodetector 30. In more specific embodiments, the photodetector 30 is aligned with the optical TSV 26, and more particularly, with an airgap 32 formed in the substrate 10 aligned with the optical TSV 26. In embodiments, the airgap 32 is formed by conventional lithography and etching processes as already described herein. More specifically, in embodiments, the airgap 32 can be formed in the substrate 10, in alignment with, e.g., overlapping, the optical TSV 26, using conventional lithography and etching processes, prior to the bonding of the substrates 10, 10'.

In embodiments, the airgap 32 has a depth ranging from about 100 nm to about 10 microns. Moreover, the airgap 32 spans the core of the annular shaped optical TSV 26 and overlaps with the optical material filling the optical TSV 26. As should be understood by those of skill in the art, the core of the annular shaped optical TSV 26 is composed of the substrate material 10, e.g., silicon.

The substrates 10, 10' can be bonded together using an oxide-oxide bond. In embodiments, the electrical TSV 28 formed in the substrate 10 will also be aligned with and in electrical contact with an electrical TSV 28' formed in the substrate 10'. In embodiments, additional devices 14 can also be formed in the substrate 10', similar to that which was already described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   an optical through substrate via (TSV) formed in a substrate and comprising an optical material filling the TSV, the optical TSV being an annular shaped via formed around a core portion comprised of a portion of the substrate, wherein the annular via has a via width "d1" between an inner wall of the annular via adjacent to the core portion and an outer wall of the annular via spaced apart from the core portion, and wherein the core portion has a circumferential dimension "d2"; and
   an electrical TSV formed in the substrate and comprising a liner of the optical material and an electrically conductive material filling remaining portions of the electrical TSV, wherein the electrical TSV has a diameter of "D1", where D1>d1.

2. The structure of claim 1, wherein the substrate is silicon and the TSVs are through silicon vias.

3. The structure of claim 1, wherein the optical material is oxide material.

4. The structure of claim 1, wherein the electrical TSV is via shape.

5. The structure of claim 4, wherein a width dimension of the optical TSV is smaller than a width dimension of the electrical TSV.

6. The structure of claim 4, wherein the optical TSV and the electrical TSV extend entirely through the substrate composed of silicon.

7. The structure of claim 4, further comprising at least one additional device in the substrate material.

8. The structure of claim 1, further comprising an airgap formed in the substrate material and in alignment with the optical TSV.

9. The structure of claim 8, further comprising a photodetector in alignment with the airgap and the optical TSV.

10. The structure of claim 9, wherein the airgap spans the core and overlaps with the optical material filling the TSV of the optical TSV.

11. The structure of claim 10, wherein the photodetector is provided in another substrate which is bonded to the substrate material having the optical TSV.

12. A structure comprising:
    an optical through silicon via (TSV) formed in the silicon and having an annular shape filled with an optical material which surrounds a core composed of the silicon;
    an electrical TSV formed in the silicon and having a via shape and comprising a liner of the optical material and an electrically conductive material filling remaining portions of the electrical TSV;
    wherein the optical material is recessed in the silicon and an airgap is formed in the silicon and in alignment with a recessed surface of the optical material of the optical TSV; and
    a photodetector in alignment with the airgap and the optical TSV, wherein the airgap is interposed between the photodetector and the recessed surface of the optical material of the optical TSV.

13. The structure of claim 12, wherein the optical material is oxide material.

14. The structure of claim 12, wherein a width dimension of the optical TSV is smaller than a width dimension of the electrical TSV.

15. The structure of claim 12, further comprising at least one additional device in a silicon substrate which comprises the optical TSV and the electrical TSV.

16. The structure of claim 12, wherein the airgap spans the core and overlaps with the optical material filling the TSV of the optical TSV.

17. The structure of claim 12, wherein the photodetector is provided in another substrate which is bonded to a silicon substrate comprising the optical TSV.

18. The structure of claim 17, wherein the other substrate includes an electrical TSV which electrically contacts the electrical TSV comprising the liner and conductive material.

19. A method comprising:
    forming a first via of an annular shape having a core region of substrate material and a second via of a different shape than the first via in a substrate using a same lithography process;
    filling the first via with optical material which surrounds the core region composed of the substrate material while forming a liner on sidewalls of the second via with the optical material, in a same deposition process;
    filling remaining portions of the second via with electrically conductive material;
    removing a back side of the substrate to form an annular optical TSV comprising the first via with the optical material and the core region and an electrical via from the second via with the optical material and the electrically conductive material; and
    forming an airgap in the substrate in alignment with the annular optical TSV by recessing the optical material and the core region of substrate material in the first via; and
    bonding a photodetector to the substrate in alignment with the airgap and a recessed surface of the optical material and the core region of the substrate material in the first via.

* * * * *